(12) United States Patent
Matsuki et al.

(10) Patent No.: US 7,759,246 B2
(45) Date of Patent: Jul. 20, 2010

(54) SEMICONDUCTOR DEVICE HAVING A PLURALITY OF SEMICONDUCTOR CHIPS AND METHOD FOR MANUFACTURING THE SAME

(75) Inventors: Hirohisa Matsuki, Kawasaki (JP); Yoshitaka Aiba, Kawasaki (JP); Mitsutaka Sato, Kawasaki (JP); Tadahiro Okamato, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 275 days.

(21) Appl. No.: 11/477,550

(22) Filed: Jun. 30, 2006

(65) Prior Publication Data

US 2006/0246623 A1 Nov. 2, 2006

Related U.S. Application Data

(60) Division of application No. 10/860,657, filed on Jun. 4, 2004, now Pat. No. 7,084,513, which is a continuation of application No. PCT/JP01/10722, filed on Dec. 7, 2001.

(51) Int. Cl.
*H01L 29/41* (2006.01)
*H01L 23/52* (2006.01)

(52) U.S. Cl. ............... 438/629; 438/526; 438/614; 438/675

(58) Field of Classification Search .......... None
See application file for complete search history.

(56) References Cited

U.S. PATENT DOCUMENTS 5,430,329 A * 7/1995 Harada et al. ............ 257/786

| | | |
|---|---|---|
| 5,903,049 A | 5/1999 | Mori |
| 6,100,594 A | 8/2000 | Fukui et al. |
| 6,181,002 B1 | 1/2001 | Juso et al. |

(Continued)

FOREIGN PATENT DOCUMENTS

EP 0 706 208 A2 4/1996

(Continued)

OTHER PUBLICATIONS

Japanese Office Action mailed Dec. 19, 2006, issued in corresponding Japanese Application No. 2003-550280.

(Continued)

*Primary Examiner*—Zandra Smith
*Assistant Examiner*—Pamela Perkins
(74) *Attorney, Agent, or Firm*—Westerman, Hattori, Daniels & Adrian, LLP

(57) ABSTRACT

A semiconductor device includes a first semiconductor chip (5) having a first terminal (7) on one surface, a second semiconductor chip (1a) which is larger than the first semiconductor chip (5) and on which the first semiconductor chip (5) is stacked and which has a second terminal (3) on one surface, an insulating layer (10) formed on a second semiconductor chip (1a) to cover the first semiconductor chip (5), a plurality of holes (10a) formed in the insulating layer (10) on at least a peripheral area of the first semiconductor chip (5), a via (11a) formed like a film on inner peripheral surfaces and bottom surfaces of the holes (10a) and connected electrically to the second terminal (3) of the second semiconductor chip (1a), a wiring pattern (11b) formed on an upper surface of the insulating layer (10), and an external terminal (14) formed on the wiring pattern (11b).

8 Claims, 16 Drawing Sheets

U.S. PATENT DOCUMENTS

| | | |
|---|---|---|
| 6,344,682 B1 | 2/2002 | Tomita |
| 6,348,728 B1 | 2/2002 | Aiba et al. |
| 6,452,278 B1 | 9/2002 | DiCaprio et al. |
| 6,476,500 B2 | 11/2002 | Kimura |
| 6,548,911 B2 | 4/2003 | Yu et al. |
| 6,563,205 B1 | 5/2003 | Fogal et al. |
| 6,700,178 B2 | 3/2004 | Chen et al. |
| 6,734,568 B2 * | 5/2004 | Matsuo et al. ............... 257/781 |
| 6,759,737 B2 | 7/2004 | Seo et al. |
| 6,765,299 B2 * | 7/2004 | Takahashi et al. ........... 257/777 |
| 6,849,945 B2 | 2/2005 | Horiuchi et al. |
| 7,084,513 B2 * | 8/2006 | Matsuki et al. ............. 257/777 |
| 7,294,587 B2 * | 11/2007 | Asahi et al. ................. 438/782 |
| 2001/0015496 A1 | 8/2001 | Watase et al. |
| 2002/0050639 A1 | 5/2002 | Aiba et al. |
| 2006/0008944 A1 * | 1/2006 | Shizuno ...................... 438/109 |

FOREIGN PATENT DOCUMENTS

| | | |
|---|---|---|
| JP | 2001-217381 A | 8/2001 |
| JP | 2001-250836 | 9/2001 |
| JP | 2001-257310 A | 9/2001 |
| JP | 2001-298149 A | 10/2001 |
| JP | 2002-50721 | 2/2002 |
| KR | 2001-0063892 | 7/2001 |

OTHER PUBLICATIONS

Supplemental Search Report dated Apr. 9, 2008 issued in corresponding Japanese Application No. 01274912.3-2203 PCT/JP0110722.
Office Action from the Korean Patent Office dated Jan. 27, 2006 in corresponding Korean Patent Application No. 10-2004-7008710.

* cited by examiner

PRIOR ART

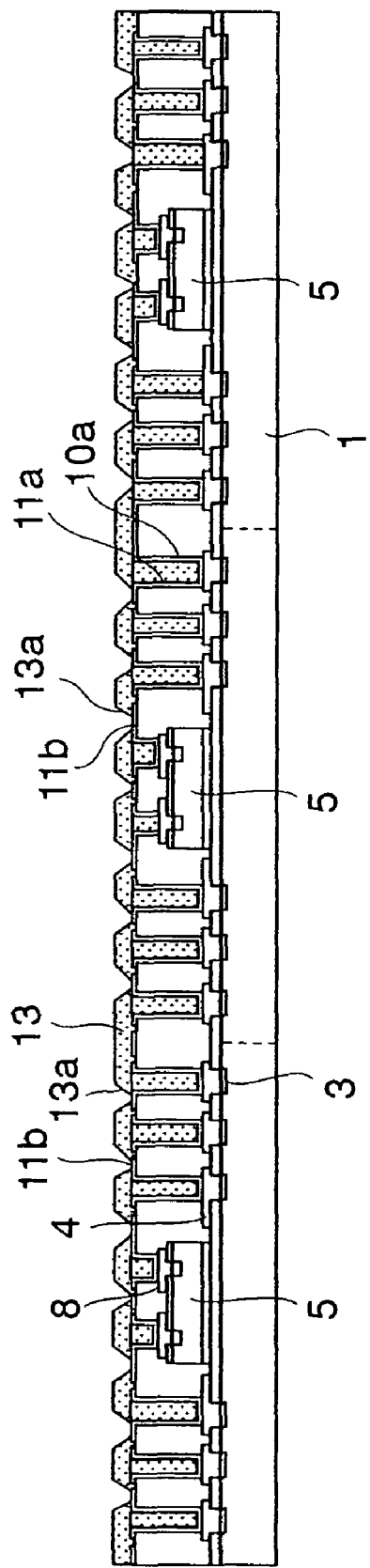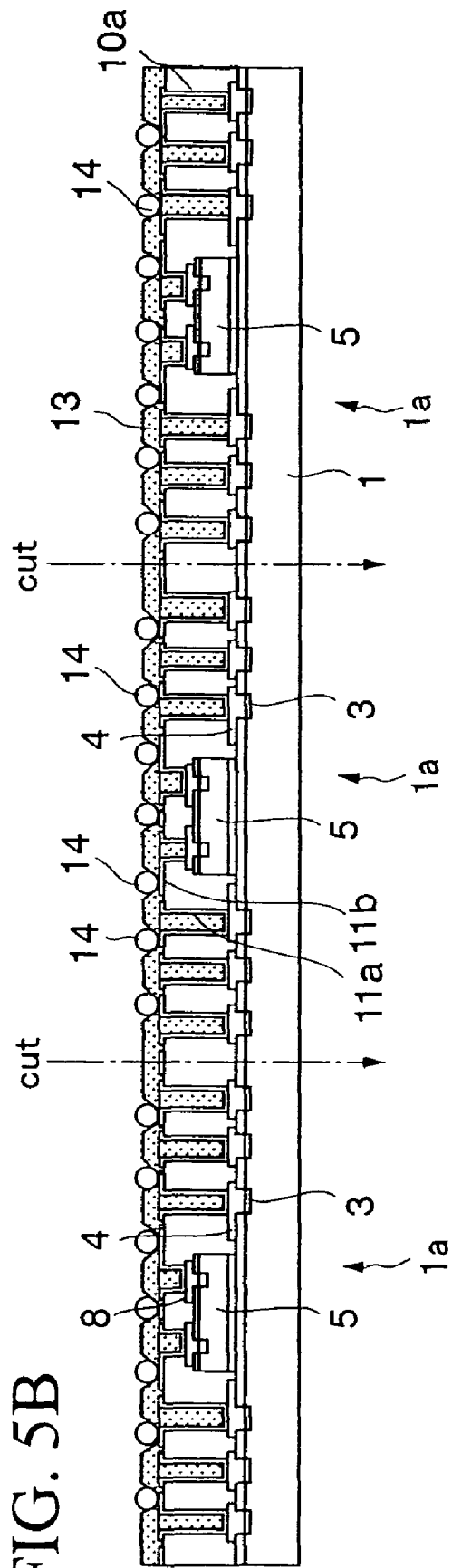

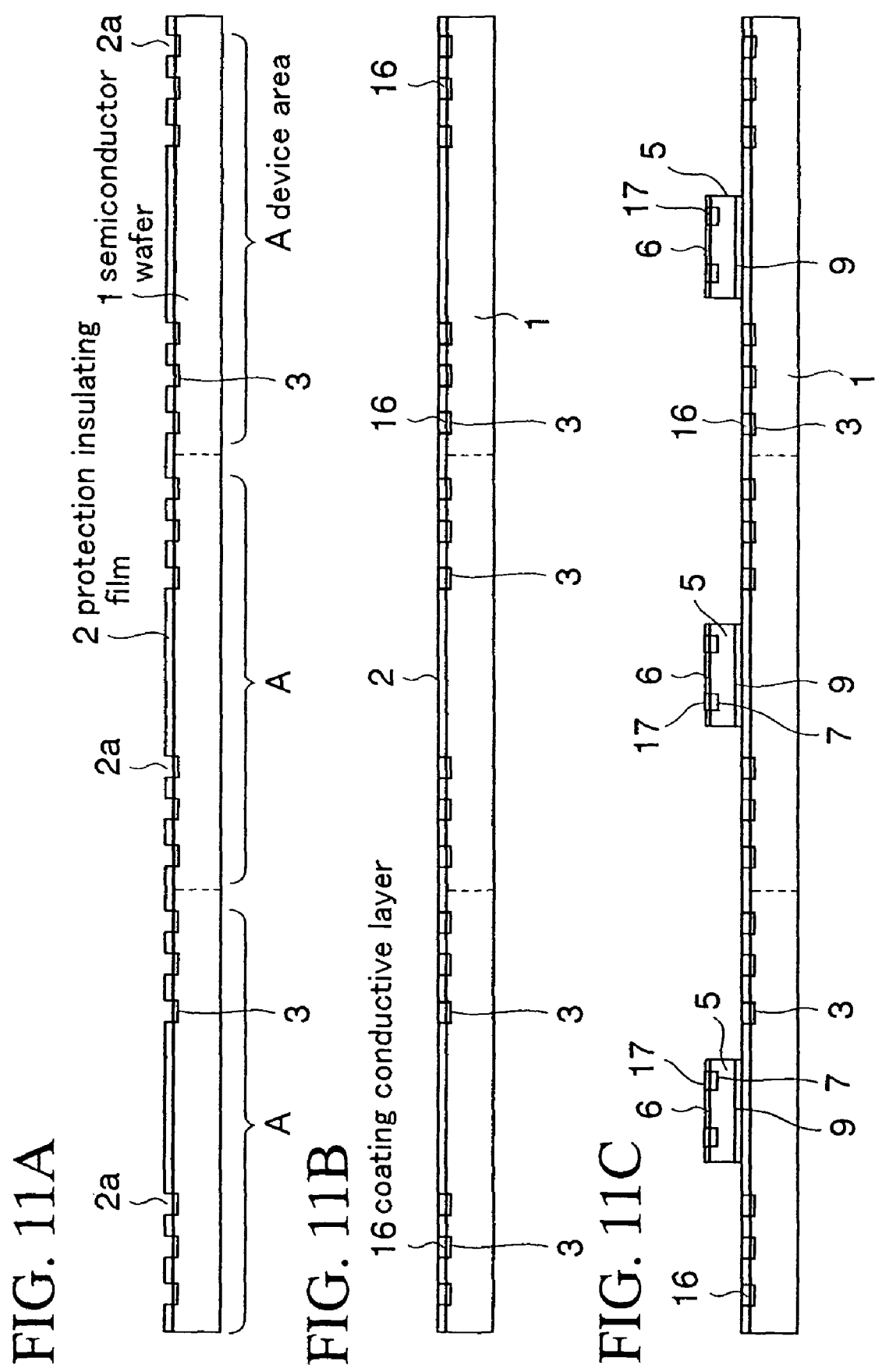

SEMICONDUCTOR DEVICE HAVING A PLURALITY OF SEMICONDUCTOR CHIPS AND METHOD FOR MANUFACTURING THE SAME

RELATED APPLICATION

This application is a divisional of U.S. patent application Ser. No. 10/860,657 filed on Jun. 4, 2004, which is a continuation of PCT/JP01/10722 filed Dec. 7, 2001, which are incorporated by reference in their entirety. Priority under 35 U.S.C. 120 and 121 is hereby claimed for benefit of the filing date of U.S. patent application Ser. No. 10/860,657.

TECHNICAL FIELD

The present invention relates to a semiconductor device and a method for manufacturing the same and, more particularly, a semiconductor device having a plurality of semiconductor chips and a method for manufacturing the same.

BACKGROUND ART

In the mobile information terminals including the next generation mobile phone and the mobile PC, improvements of reduction in size, weight and thickness are considered as a key point. For this reason, in order to enhance a competitive power in the technology of the mobile information terminal that is expected to grow highly in future, it is important to develop the high-density packaging technology that is capable of realizing further reduction in size, weight and thickness.

As the high-density packaging technology, there exist a variety of technologies such as flip-chip packaging, multi-chip module, stacked substrate, and so forth. In addition, according to the need to incorporate a plurality of functions into the package, the technological development in the chip size package (CSP) having a structure in which semiconductor chips are stacked is advanced, and further the wafer level CSP using no interposer substrate is developed.

The wafer level CSP has a structure shown in FIG. 1, for example.

In FIG. 1, wirings 102 are formed on a first semiconductor device chip 101, and a second semiconductor device chip 104 is secured to the wirings 102 via solder balls 103. The second semiconductor device chip 104 is smaller in size than the first semiconductor device chip 101.

Also, pin type terminals (vias) 105 are connected to the wirings 102 on the first semiconductor device chip 101 in the peripheral area of the second semiconductor device chip 104. In addition, a sealing resin 106 for sealing the second semiconductor device chip 104 is formed on an upper surface of the first semiconductor device chip 101 to have such a thickness that upper ends of the terminals 105 are exposed from the resin. A solder ball 107 is connected to the upper ends of the terminals 105 respectively.

However, the terminals 105 shown in FIG. 1 are formed on the wirings 102 by the plating method. Thus, it takes much time to form the terminals 105 and thus throughput of the CSP formation is gone down.

Also, forming areas of the terminals 105 are limited to the periphery of the second semiconductor device chip 104. Thus, it is not expected to increase the number of the terminals 105.

DISCLOSURE OF THE INVENTION

It is an object of the present invention to provide a semiconductor device capable of expanding an external terminal forming area in a stacked structure of a plurality of semiconductor chips and also forming easily external terminals.

The above subject can be overcome by providing a semiconductor device which comprises a first semiconductor chip having a first terminal on one surface; a second semiconductor chip which is larger than the first semiconductor chip and on which the first semiconductor chip is stacked, and which has a second terminal on one surface; an insulating layer formed on second semiconductor chip to cover the first semiconductor chip; a plurality of holes formed in the insulating layer; a conductive via formed like a film on inner peripheral surfaces and bottom surfaces of the holes and connected electrically to at least one of the first terminal and the second terminal; a first wiring pattern formed on an upper surface of the insulating layer; and an external terminal formed on the first wiring pattern.

According to the present invention, in the semiconductor device having the structure in which the first and second semiconductor chips formed in different size respectively are stacked, the insulating layer for covering the first semiconductor chip is formed on the second semiconductor chip, the holes are formed in the insulating layer, the film-like vias are formed in the hole respectively, and the wiring patterns are formed on the insulating layer.

Therefore, since the film-like vias are formed not to completely fill the holes, the vias can be formed in a short time, and both the wiring patterns and the vias can be formed by the same conductive film, and thus the number of the film forming steps can be reduced.

Also, the wiring patterns formed on the insulating layer are led onto the first semiconductor chip and then the external terminals are formed on the wiring patterns. Therefore, the narrower pitch between plural external terminals on the insulating layer can be suppressed, and also the number of the external terminals can be increased.

In addition, corrosion of the vias can be prevented by covering the vias in the holes with the insulating layer. Also, migration short and corrosion of the first wiring patterns can be prevented by covering the first wiring patterns except the portions to be connected to the wiring patterns on the insulating layer with another insulating layer.

Meanwhile, the wafer-level laminated package can be formed by the same technology independently of whether a circuit surface of the first semiconductor chip on which the first terminals are formed is face-up or face-down bonded on a circuit surface of the second semiconductor chip on which the first terminals are formed. Also, the face up bonding or the face down bonding can be used in its proper way, and also the semiconductor devices having various functions can be stacked. Therefore, the present invention is useful.

Also, since the first wiring patterns are provided over the first semiconductor chip and the second semiconductor chip, the external terminals can be formed at any positions to correspond to a multi-pin structure.

In addition, a plurality of semiconductor chips can be mounted by forming the above insulating layer having the wiring patterns and the vias therein as a multi-layered structure or by stacking the above mentioned structures.

BRIEF DESCRIPTION OF THE DRAWING

FIGS. 5A and 5B are sectional views (#4) showing steps of manufacturing the semiconductor device according to the first embodiment of the present invention;

FIGS. 11A to 11C are sectional views (#1) showing steps of manufacturing a semiconductor device according to a third embodiment of the present invention;

BEST MODES FOR CARRYING OUT THE INVENTION

Embodiments of the present invention will be explained with reference to the drawings hereinafter.

First Embodiment

FIG. 2 to FIG. 5 are sectional views showing steps of forming a multi-chip package (MCP) according to a first embodiment of the present invention.

Figure 2A:
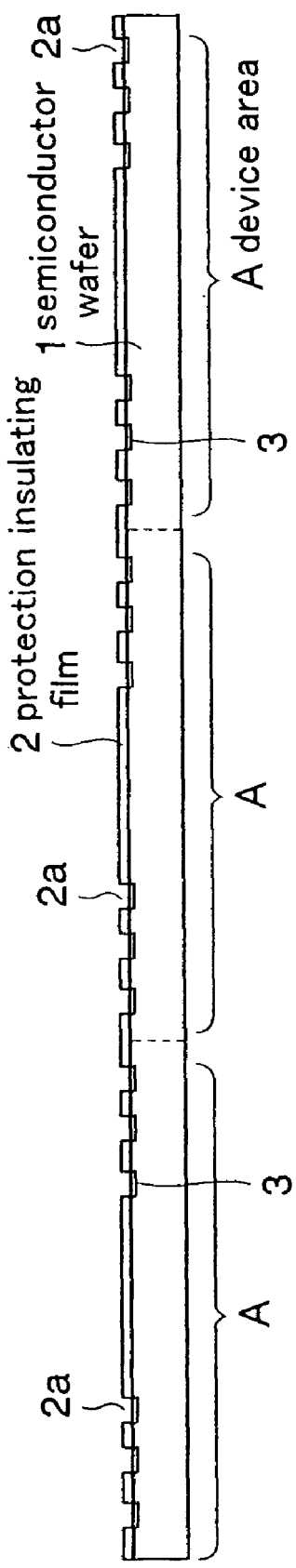
FIGS. 2A to 2C are sectional views (#1) showing steps of manufacturing a semiconductor device according to a first embodiment of the present invention.
Figure 6A:
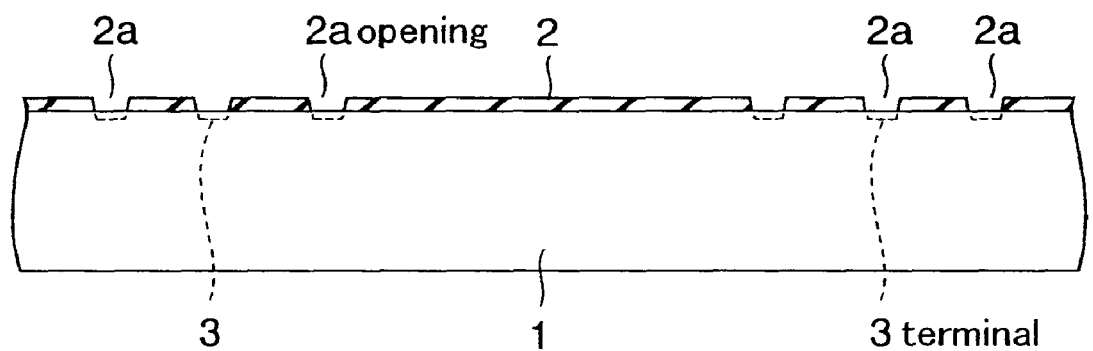
FIG. 6A is a sectional view showing a semiconductor wafer constituting the semiconductor device according to the first embodiment of the present invention.

First, as shown in FIG. 2A, a semiconductor wafer 1 in which a first semiconductor circuit (not shown) is formed in a plurality of device areas A respectively is prepared. The semiconductor wafer 1 has a protection insulating layer 2 on its upper surface, as shown in a fragmental enlarged view of FIG. 6A, and openings 2*a* to expose a first terminal (conductive pad) 3 that is connected electrically to an internal wiring (not shown) of the semiconductor device are formed in the protection insulating layer 2. The first terminal 3 is formed of aluminum, copper, or the like.

Here, the semiconductor wafer 1 is composed of a silicon wafer, for example, and is cut away in the later step every first semiconductor circuit and divided into the device area A unit.

Figure 2B:
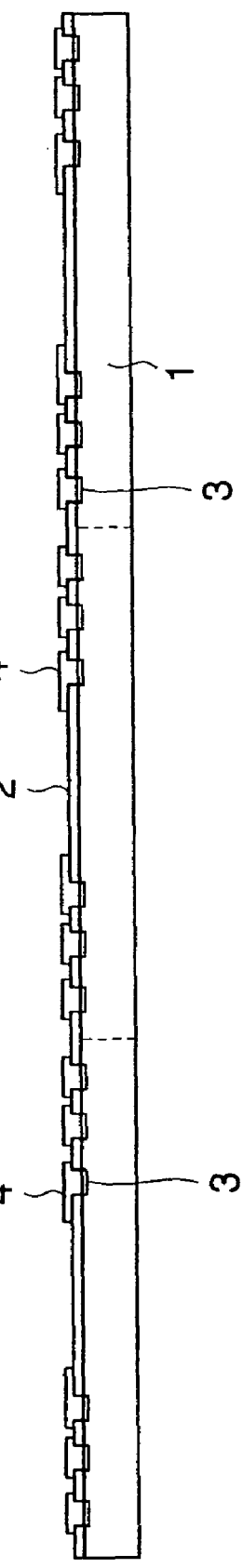

Then, as shown in FIG. 2B, first rewiring patterns 4 are formed by forming a metal film having a double-layered structure made of titanium and nickel on the protection insulating layer 2 and the first terminals 3 to have a thickness of about 0.5 fÊm, and then patterning the metal film by means of the photolithography method. The first rewiring pattern 4 is a conductive pattern that is led from an upper surface of the first terminal 3 to an upper surface of the protection insulating layer 2.

Figure 6B:
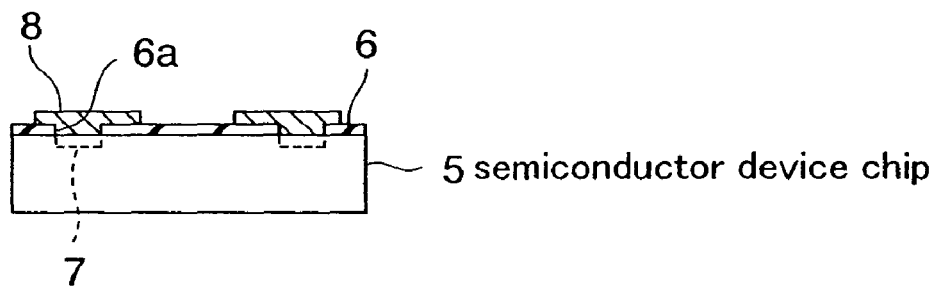
FIG. 6B is a sectional view showing a semiconductor device chip constituting the semiconductor device according to the first embodiment of the present invention.

Then, as shown in FIG. 6B, first semiconductor device chips 5 on which a second semiconductor circuit (not shown) is formed respectively are prepared. The first semiconductor device chip 5 is formed of a silicon chip, for example, which is smaller than the device area A of the semiconductor wafer 1, and has a protection insulating layer 6 on its upper surface. Openings 6*a* to expose second terminals 7 that are connected to wirings (not shown) in the first semiconductor device chip 5 are formed in the protection insulating layer 6. Also, second rewiring patterns 8 each of which is led from an upper surface of the second terminal 7 are formed on the protection insulating layer 6.

Figure 2C:
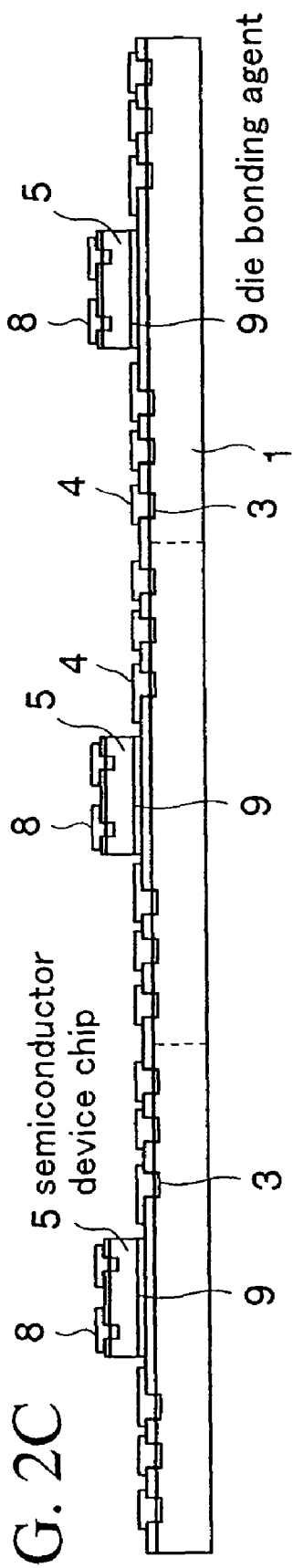

Then, as shown in FIG. 2C, a bottom surface of each first semiconductor device chip 5 is bonded to a center portion of the device area A of the semiconductor wafer 1 via a die bonding agent (adhesive) 9.

Figure 3A:
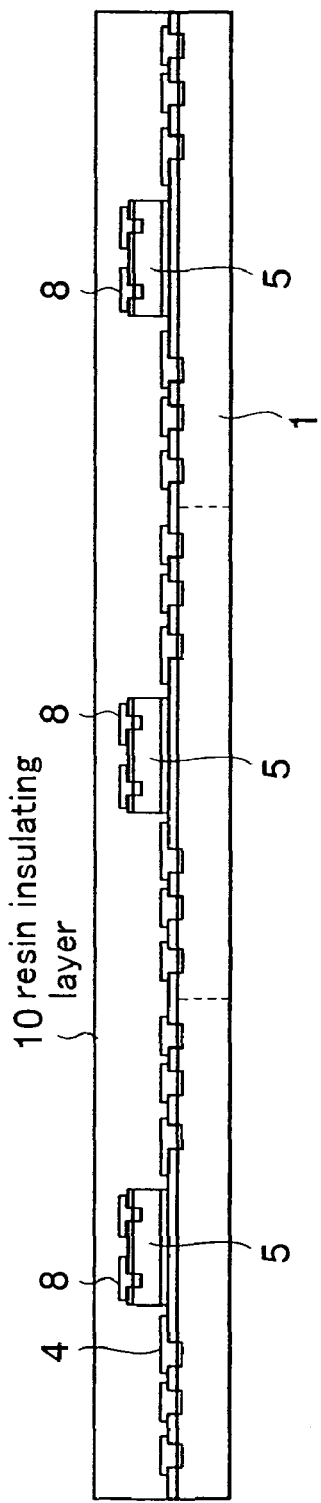
FIGS. 3A to 3C are sectional views (#2) showing steps of manufacturing the semiconductor device according to the first embodiment of the present invention.

Then, as shown in FIG. 3A, a resin insulating layer 10 made of epoxy, polyimide, or the like is formed on an upper surface of the semiconductor wafer 1 to have a thickness that is higher than the first semiconductor device chip 5 by about 10 to 20 fÊm. Thus, the first semiconductor device chips 5 are covered with the resin insulating layer 10.

The resin insulating layer 10 is formed on the semiconductor wafer 1 by the spin coating, the printing, the laminating method, or the like. For example, in the case where the laminating method is employed, a countermeasure to prevent generation of the bubble in overlying areas of the first semiconductor device chips 5 and their peripheral areas must be taken by adjusting sufficiently a film thickness of the resin insulating layer 10, etc.

Also, in the case where it is difficult to planarize a surface of the resin insulating layer 10 owing to material characteristics of the resin insulating layer 10, it is desired to planarize an upper surface of the resin insulating layer 10 by the mechanical polishing using the surface polishing technique, the chemical-mechanical polishing (CMP), the chemical polishing, or the like after the resin insulating layer 10 is formed on the semiconductor wafer 1. For example, the resin insulating layer 10 made of epoxy resin, polyimide, or the like, for example, is formed on the semiconductor wafer 1 to have a thickness of 120 to 150 fÊm, for example, and then the upper surface of the resin insulating layer 10 is planarized by the mechanical polishing method or the chemical-mechanical polishing method.

Figure 3B:
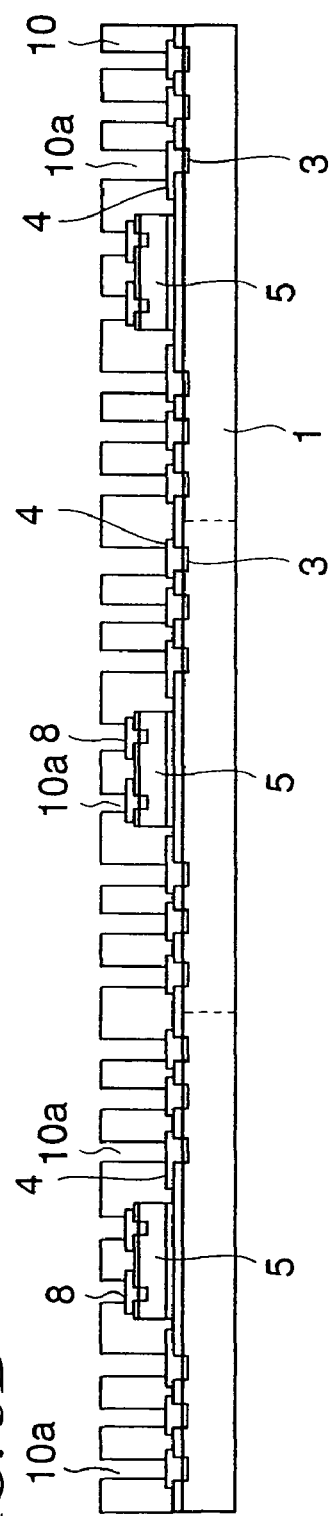

Then, as shown in FIG. 3B, via holes (through holes) 10*a* each having a diameter of 80 to 100 fÊm are formed in the resin insulating layer 10 on the first rewiring patterns 4 and the second rewiring patterns 8 respectively.

In the case where the photosensitive resin material is selected as the resin insulating layer 10, the via holes 10*a* are formed easily by exposing the resin insulating layer 10 by using an exposure mask for the via hole formation and then developing the resin insulating layer 10 by using an inorganic alkaline solution such as sodium carbonate ($NaCO_3$), or the like after the resin insulating layer 10 is formed on the semiconductor wafer 1 in the non-exposure light environment.

Upper portions of the via holes 10*a* are expanded in a taper shape when the via holes 10*a* are formed by using such exposure and development. Therefore, various processes applied to the insides of the via holes 10a and described later are facilitated. In this case, since the first terminals 3 formed under the via holes 10a are covered with the first rewiring patterns 4, the corrosion of the first terminals 3 caused by the inorganic alkaline solution can be prevented.

Meanwhile, in the case where the non-photosensitive material is selected as the constitutive material of the resin insulating layer 10, it is preferable that the via holes 10a should be formed by irradiating a high energy such as the laser, or the like onto predetermined positions of the resin insulating layer 10. In the case where the via holes 10a are formed by the laser, it is not possible that the first terminals 3 made of the relatively soft conductive material such as aluminum, copper, or the like and the neighboring protection insulating layer 2 are removed or deteriorated by the laser irradiation because the first terminals 3 and the protection insulating layer 2 located under the via holes 10a are covered with the first rewiring pattern 4 made of a hard metal.

In some case, the via holes 10a may be formed by the drilling.

Figure 1:
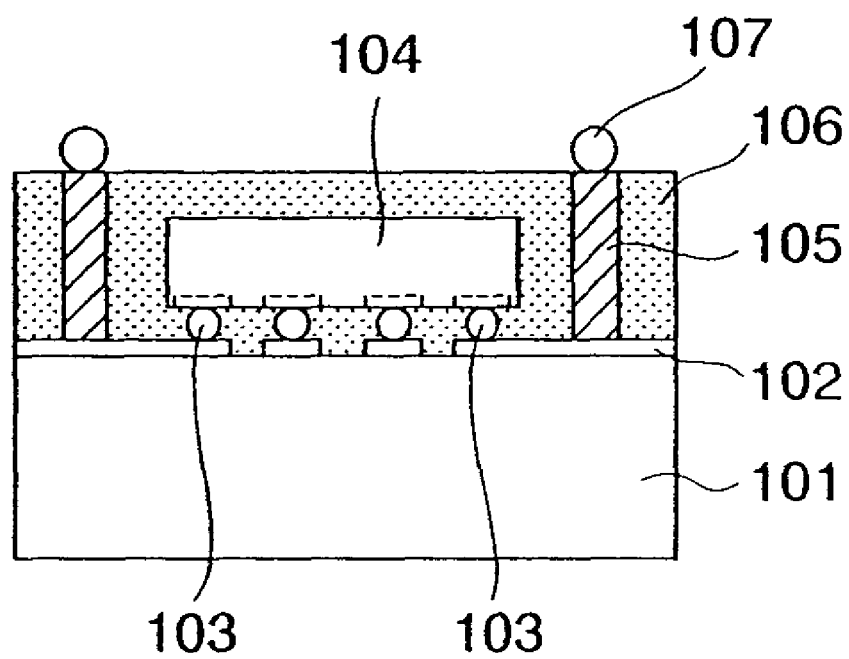
FIG. 1 is a sectional view showing a semiconductor device having the conventional structure.
Figure 3C:
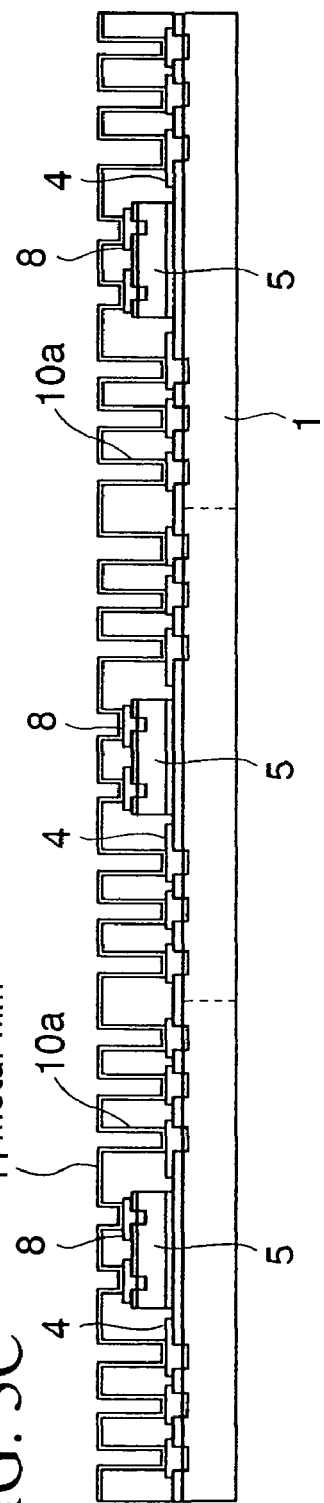

Then, as shown in FIG. 3C, the surface of the resin insulating layer 10 is activated by the diluent solvent, and then a metal film 11, e.g., a copper film, of 0.5 to 1.0 fÊm thickness is formed on the upper surface of the resin insulating layer 10 and inner peripheral surfaces and bottom surfaces of the via holes 10a by the electroless plating. The metal film 11 having such thickness is formed in a very short time in contrast to the case where the external terminals 105 shown in FIG. 1 are formed by the plating. In this case, the metal film 11 is connected to the upper surfaces of the first rewiring patterns 4 in the via holes 10a. The metal film may be formed herein to have a multi-layered structure.

At this time, when it is desired to form the metal film 11 of about 3 to 5 fÊm thickness, a method for forming the film thin once by virtue of the electroless plating method and then forming the film thick by virtue of the electroplating method may be employed. Also, in the case where the resin insulating layer 10 is formed of epoxy resin or polyimide, the growth of the metal film 11 on the upper surface of the resin insulating layer 10 and the inner surfaces of the via holes 10a by the electroless plating is easy.

Figure 4A:
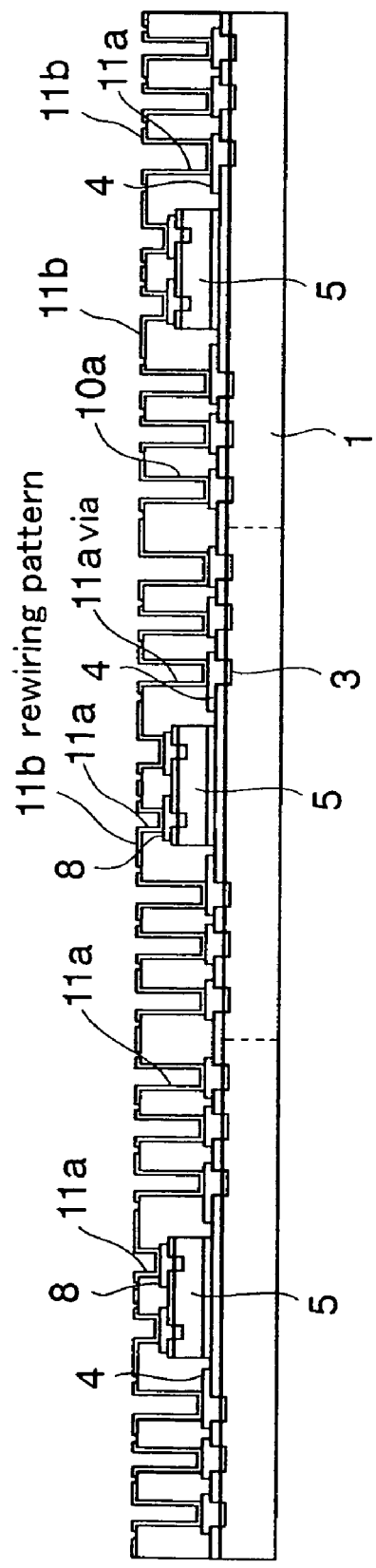
FIGS. 4A and 4B are sectional views (#3) showing steps of manufacturing the semiconductor device according to the first embodiment of the present invention.

Then, as shown in FIG. 4A, the metal film 11 is patterned by the photolithography method. Thus, the metal film 11 in the via holes 10a is left as vias 11a and also patterns of the metal film 11 on the upper surface of the resin insulating layer 10 are used as third rewiring patterns 11b. As a result, a plurality of third rewiring patterns 11b on the resin insulating layer 10 are connected electrically to the second terminals 7 of the first semiconductor device chips 5 via the holes 10a and the second rewiring patterns 8 respectively, and also connected electrically to the first terminals 3 of the semiconductor wafer 1 via the vias 11a and the first rewiring patterns 4. Also, the second terminals 7 of the first semiconductor device chips 5 are connected electrically to the first terminals 3 of the semiconductor wafer 1 via the vias 11a and the third rewiring patterns 11b respectively. In this case, all the vias 11a are connected to the third rewiring patterns 11b respectively, but the vias 11a that are not connected to such pattern may be provided.

Figure 4B:
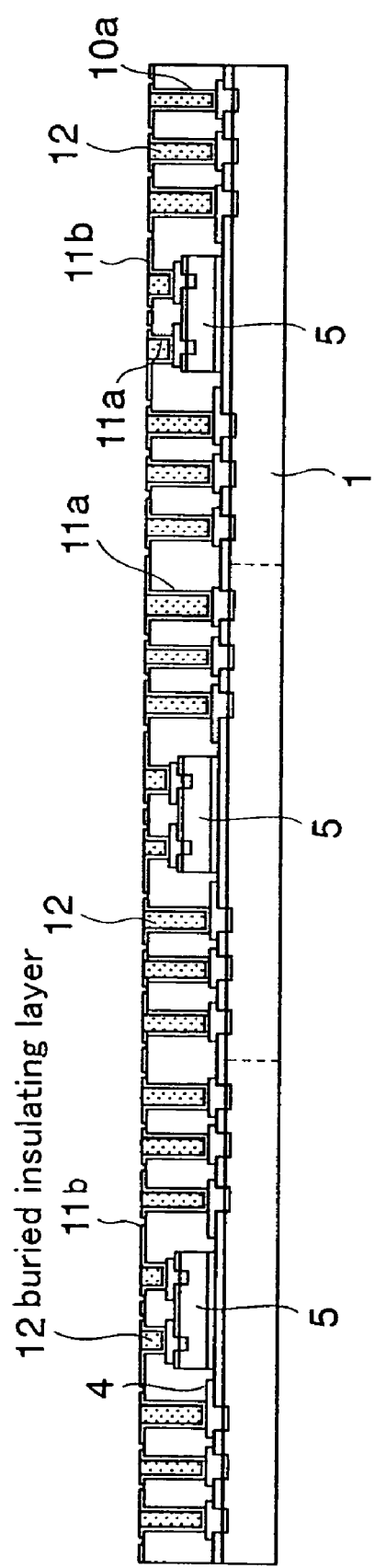

Then, as shown in FIG. 4B, buried insulating layers 12 are formed by filling the non-photosensitive epoxy resin into the opening portions 10a in the resin insulating layer 10 by using the squeegee or the printing method. Thus, the via 11a in the opening portion 10a is covered with the buried insulating layer 12.

Then, as shown in FIG. 5A, an insulating resin cover layer 13 made of a photosensitive epoxy resin, a photosensitive novolak resin, or the like is formed on the resin insulating layer 10, the third rewiring patterns 11b, and the buried insulating layers 12 respectively. The resin cover layer 13 is coated on the resin insulating layer 10 in the non-exposure light environment by using the squeegee or by the printing method. The resin cover layer 13 prevents corrosion of the third rewiring patterns 11b and prevents the migration short of the third rewiring patterns 11b.

In addition, openings 13a for exposing contact portions of the third rewiring patterns 11b are patterned by exposing/developing the resin cover layer 13.

Then, as shown in FIG. 5B, external terminals 14 such as solder bumps, or the like are connected to the third rewiring patterns 11b through the openings 13a in the resin cover layer 13. In this event, since the external terminals 14 are formed in the openings 13a in the resin cover layer 13, displacement is prevented or positioning is facilitated. In this case, since a diameter of the opening 13a is expanded upward in a taper shape by the exposure and the development, the positioning and the connection of the ball-like external terminals 14 on the third rewiring patterns 11b are made easy.

Figure 7:
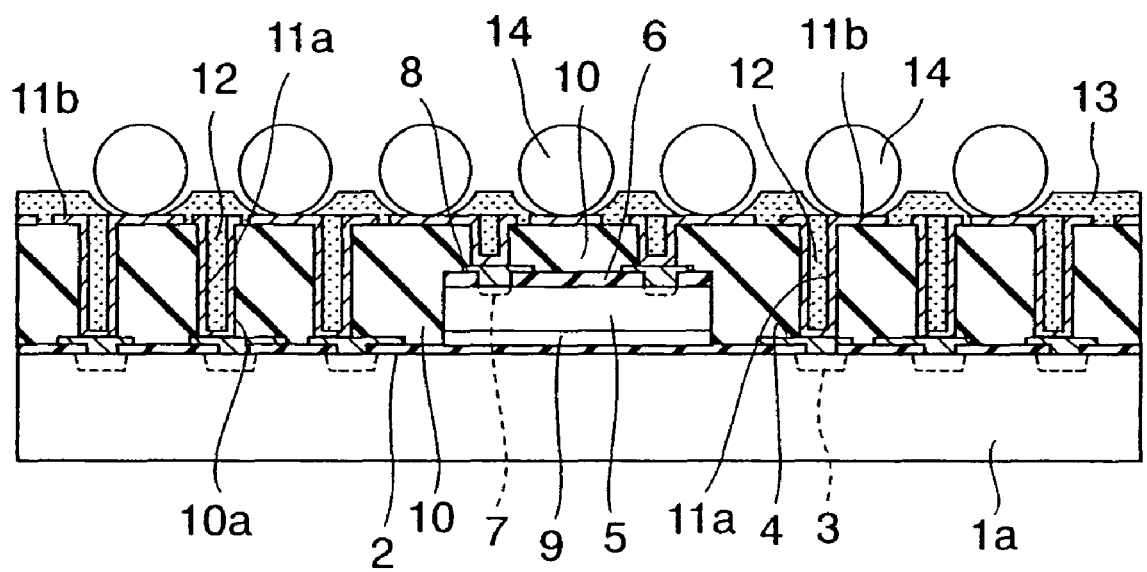
FIG. 7 is a sectional view showing the semiconductor device according to the first embodiment of the present invention.

Then, the semiconductor device is divided into a plurality of second semiconductor device chips 1a by dicing boundaries between the device areas A of the semiconductor wafer 1 shown in FIG. 5B. Thus, a plurality of MCP semiconductor devices shown in FIG. 7 are formed. In this case, side surfaces of the second semiconductor device chip 1a are not covered with the resin insulating layer 10 to expose.

Here, prior to the division of the semiconductor wafer 1, a bottom surface of the semiconductor wafer 1 may be polished by the mechanical polishing method or the chemical-mechanical polishing method.

According to the semiconductor device described above, the via holes 10a are formed around the first semiconductor device chips 5 in the resin insulating layer 10 formed on the upper surfaces of the second semiconductor device chips 1a, also the conductive films formed on the inner peripheral surfaces and the bottom surfaces of the via holes 10a are used as the vias 11a, and also the conductive films on the upper surface of the resin insulating layer 10 are used as the third rewiring patterns 11b.

Therefore, the formation of the vias 11a to be formed in the via holes 10a is executed by the step of forming the metal film 11. As a result, the vias can be formed in a short time rather than the conventional structure in which the via holes are buried completely.

Also, the portion of the metal film 11 constituting the via 11a, which is formed on the upper surface of the resin insulating layer 10, is patterned and used as the third rewiring pattern 11b. Hence, the external terminals 14 are formed over the first semiconductor device chips 5, so that the number of the external terminals 14 can be increased rather than the prior art and also a narrower pitch between the external terminals 14 can be relaxed.

In addition, since both the vias 11a and the third rewiring patterns 11b are formed by the same metal film 11, the throughput can be improved rather than the case they are formed separately respectively.

In the above example, the first semiconductor device chips 5 are adhered onto the semiconductor wafer 1, then the resin insulating layer 10, the vias 11a, the third rewiring patterns 11b, the resin cover layer 13, and the external terminals 14 are formed, and then the semiconductor wafer 1 is divided separately. However, first the semiconductor wafer 1 may be divided into a plurality of second semiconductor device chips 1a, then the first semiconductor device chips 5 may be adhered onto the second semiconductor device chips 1a respectively, and then the resin insulating layer 10, the vias 11a, the third rewiring patterns 11b, the resin cover layer 13, and the external terminals 14 may be formed. According to this, the semiconductor device having the same structure as shown in FIG. 7 is also formed. In this case, the side surfaces of the second semiconductor device chip 1a are covered with the resin insulating layer 10.

Figure 8:
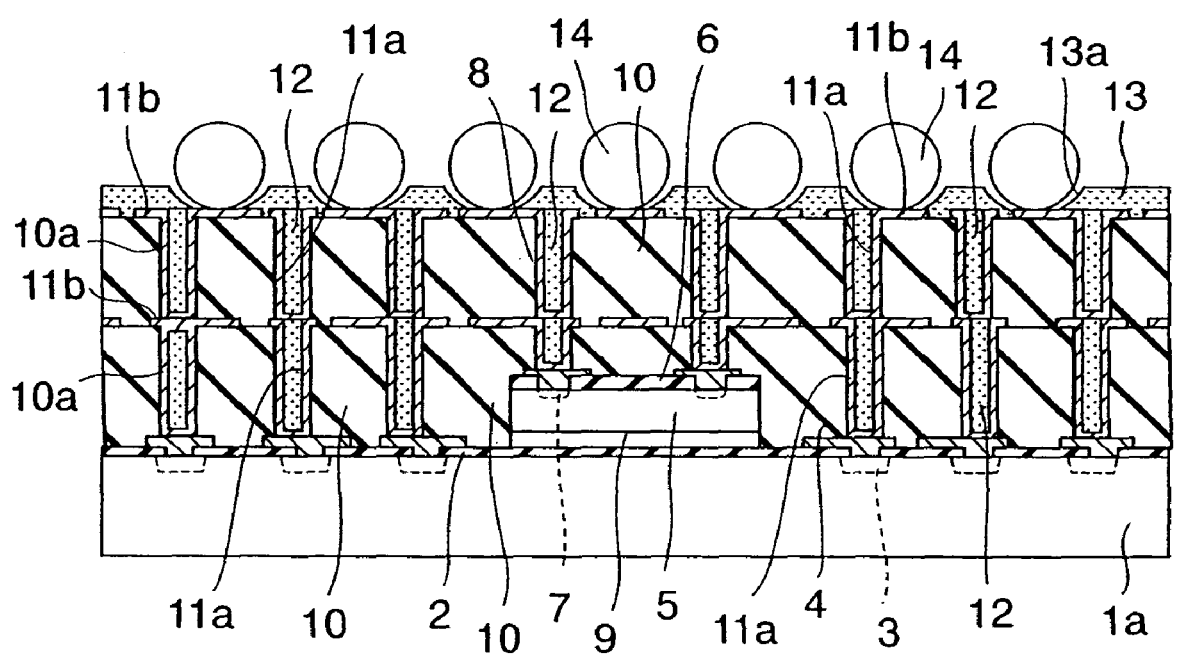
FIG. 8 is a sectional view showing a semiconductor device having a multi-layered wiring structure according to the first embodiment of the present invention.

Also, as shown in FIG. 8, the wiring structure layers having the resin insulating layer 10, the vias 11a, and the third rewiring patterns 11b may be formed as a multi-layered wiring structure having two layers or more. In this case, the resin cover layer 13 and the external terminals 14 are formed on the uppermost resin insulating layer 10. In this event, upper and lower rewiring patterns 11b are arranged in such a manner that they intersect with each other to deal with the high-speed signal processing. Such multi-layered wiring structure may be employed in embodiments given in the following.

Second Embodiment

In the first embodiment, the vias 11a and the third rewiring patterns 11b are formed, then the buried insulating layers 12 are formed in the via holes 10a, and then the resin cover layer 13 is formed on the resin insulating layer 10. However, the buried insulating layers 12 and the resin cover layer 13 may be formed at the same time.

Figure 9A:
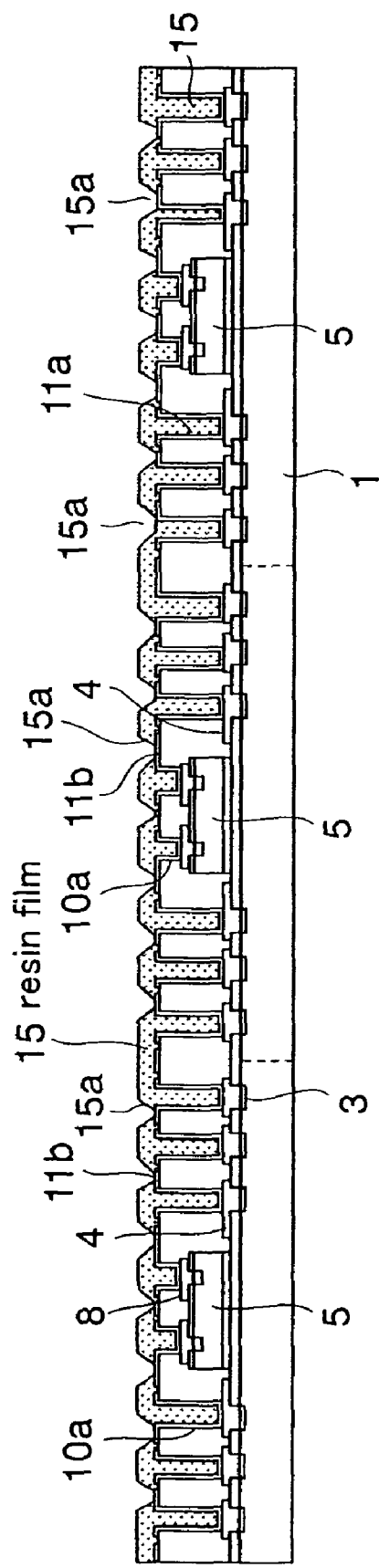
FIGS. 9A and 9B are sectional views showing steps of manufacturing a semiconductor device according to a second embodiment of the present invention.

For example, as shown in FIG. 9A, a photosensitive resin layer 15, e.g., an epoxy resin, is coated simultaneously in the via holes 10a and on the resin insulating layer 10, and then openings 15a to expose the contact portions of the third rewiring patterns 11b are formed by exposing/developing the resin layer 15.

Figure 9B:
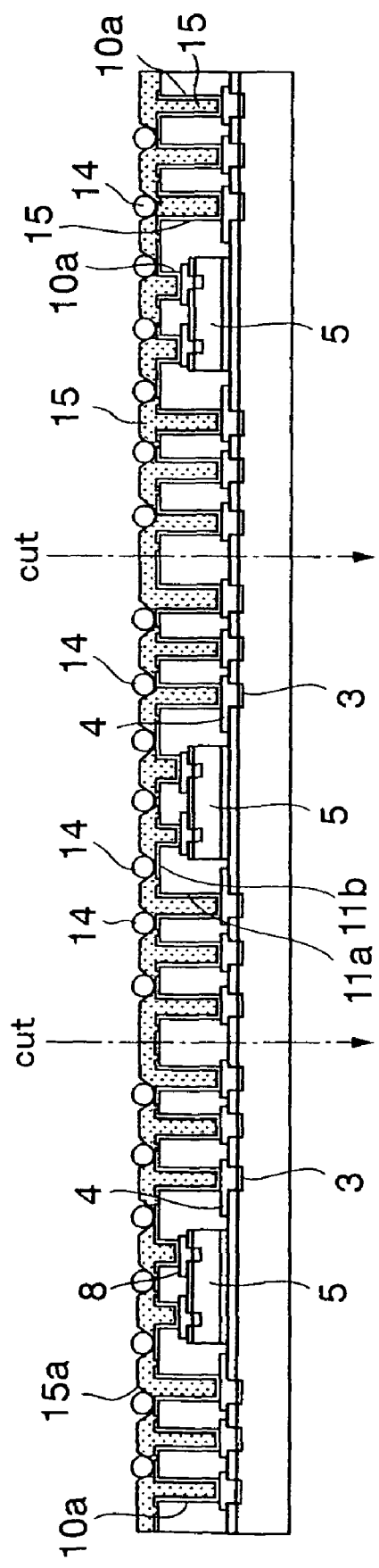

Then, as shown in FIG. 9B, the external terminals 14 are bonded to the third rewiring patterns 11b through the openings 15a in the resin layer 15.

According to this, the epoxy resin in the via holes 10a is used as the buried insulating layers respectively, and the epoxy resin on the resin insulating layer 10 is used as the resin cover layer. Also, the buried insulating layers and the resin cover layer can be formed at the same time, whereby the number of the steps of forming the insulating layer can be reduced in contrast to the first embodiment.

Figure 10:
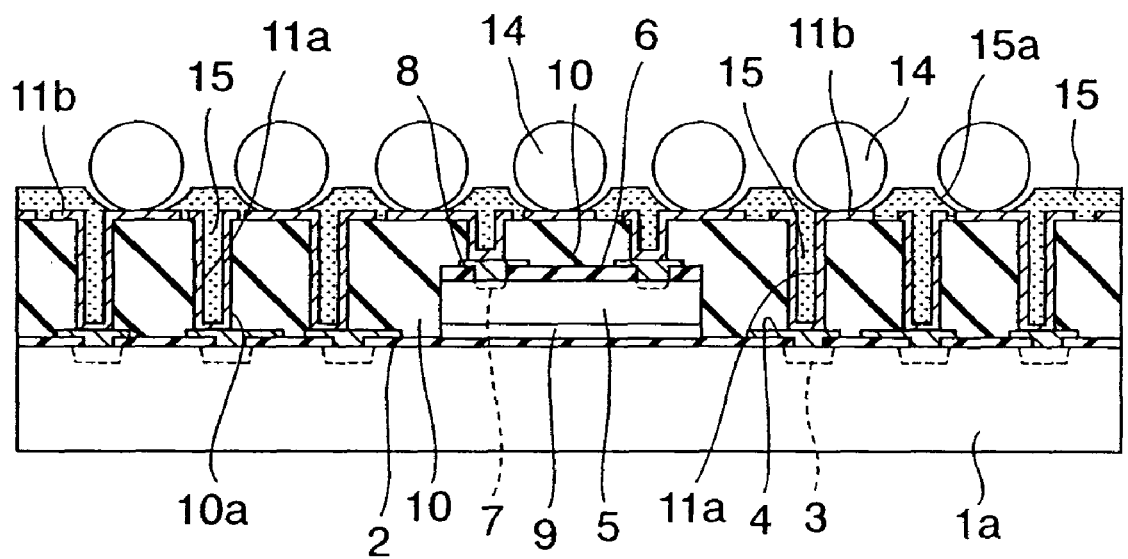
FIG. 10 is a sectional view showing the semiconductor device according to the second embodiment of the present invention.

Then, a semiconductor device shown in FIG. 10 is formed by cutting off the boundaries between the device areas A. In this case, the side surfaces of the second semiconductor device chip 1a are not covered with the resin insulating layer 10 and are exposed.

Third Embodiment

Unless the first rewiring patterns 4 are formed on the semiconductor wafer 1 shown in the first embodiment, steps described hereunder will be employed.

First, as shown in FIGS. 11A, 11B, a coating conductive layer 16 made of nickel-phosphorus (NiP), nickel, gold, or the like is formed selectively on the first terminals 3 in the openings 2a of the protection insulating layer 2 on the semiconductor wafer 1 by the electroless plating method to have a thickness of 3 to 5 fÊm.

Then, as shown in FIG. 11C, the first semiconductor device chips 5 are secured onto the semiconductor wafer 1 by the same method as the first embodiment. As the first semiconductor device chip 5, a chip having a structure in which not the second rewiring pattern but a coating conductive layer 17 made of NiP is formed on the second terminals 7 in the protection insulating layer 6 on the upper surface is employed.

Figure 12A:
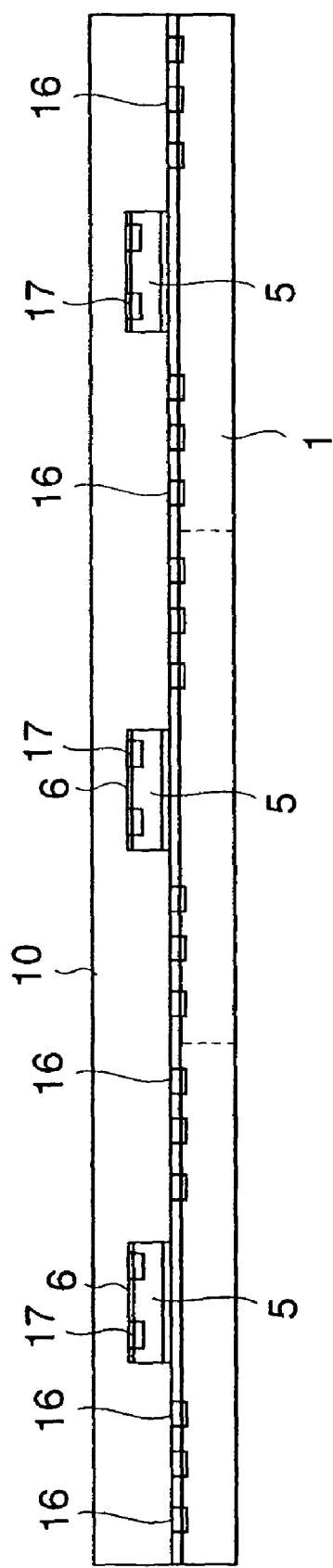
FIGS. 12A and 12B are sectional views (#2) showing steps of manufacturing the semiconductor device according to the third embodiment of the present invention.

Then, as shown in FIG. 12A, the resin insulating layer 10 is formed on the semiconductor wafer 1 to cover the first semiconductor device chip 5. The same methods as the first embodiment are employed to form and planarize the resin insulating layer 10.

Figure 12B:
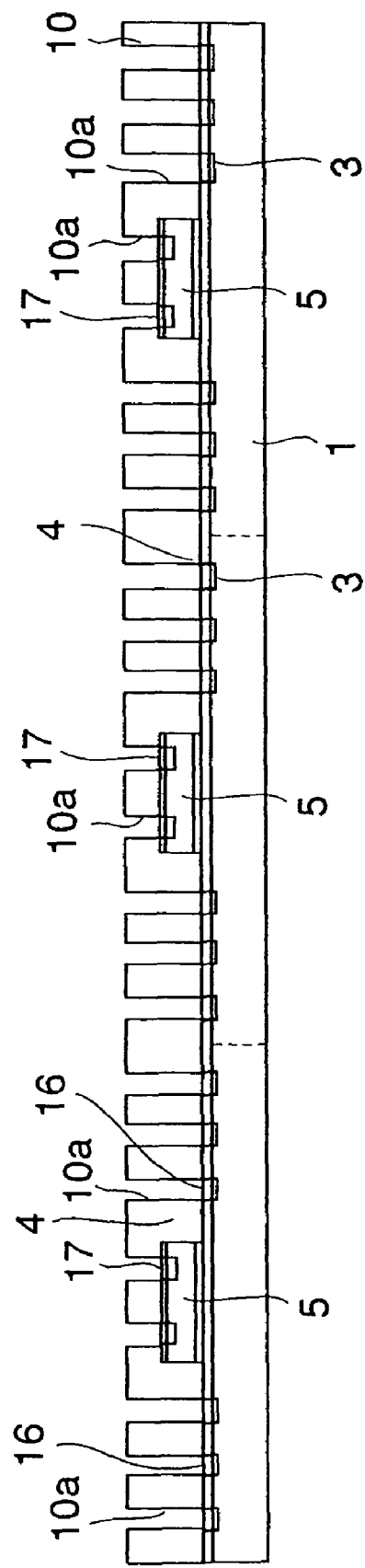

Then, as shown in FIG. 12B, the via holes 10a are formed in the resin insulating layer 10 on the coating conductive layers 16, 17 on the first and second terminals 3, 7 on the semiconductor wafer 1 and the first semiconductor device chip 5 respectively.

The same methods as those shown in the first embodiment are applied to form the via holes 10a. That is, the via holes 10a are formed by the exposure and the development when the resin insulating layer 10 is formed of the photosensitive material, while the via holes 10a are formed by the laser irradiation when the resin insulating layer 10 is formed of the non-photosensitive material. In this event, since the first and second terminals 3, 7 formed of copper or aluminum below the via holes 10a are protected by the coating conductive layers 16, 17 respectively, they are never directly exposed to the developer or the laser and thus the degradation caused by the development or the laser can be prevented. In this case, the via holes 10a may be formed by the drilling.

Figure 13A:
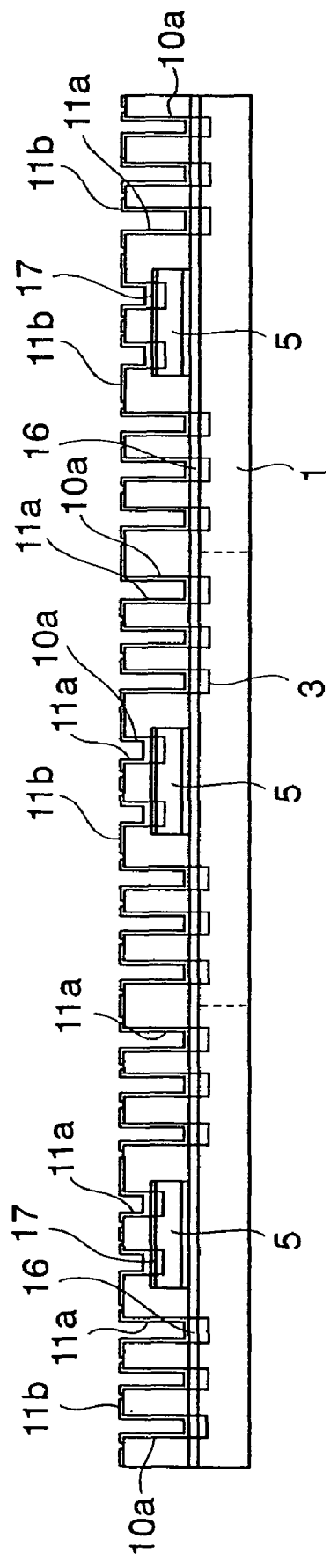
FIGS. 13A and 13B are sectional views (#3) showing steps of manufacturing the semiconductor device according to the third embodiment of the present invention.
Figure 13B:
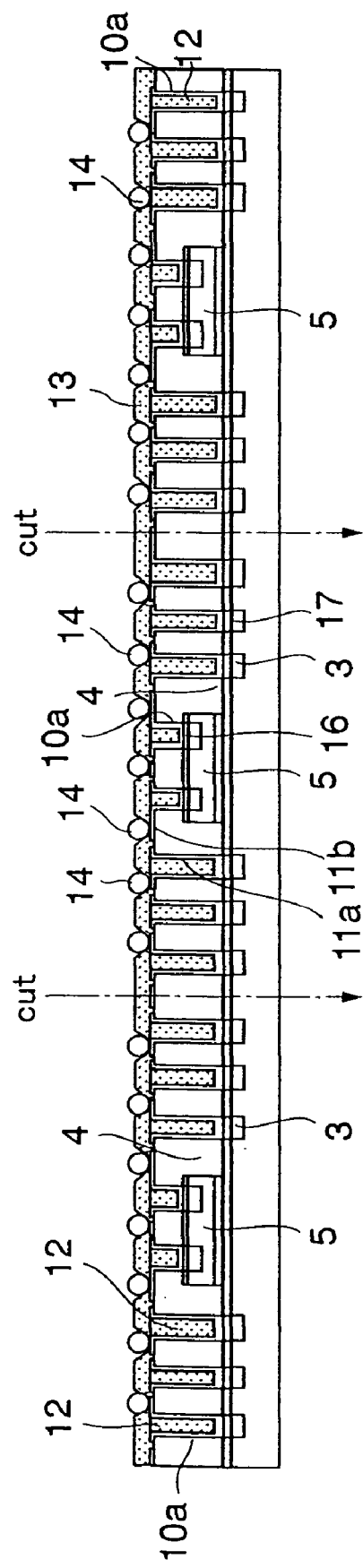

Then, as shown in FIG. 13A, the vias 11a and the third rewiring patterns 11b are formed in the via holes 10a and on the resin insulating layer 10 via the steps similar to those in the first embodiment respectively. Then, as shown in FIG. 13B, the buried insulating layers 12, the cover insulating layer 13, and the external terminals 14 are formed. In this case, the buried insulating layers 12 and the cover insulating layer 13 may be formed of the same resin layer 15 at the same time, as shown in the second embodiment.

Figure 14:
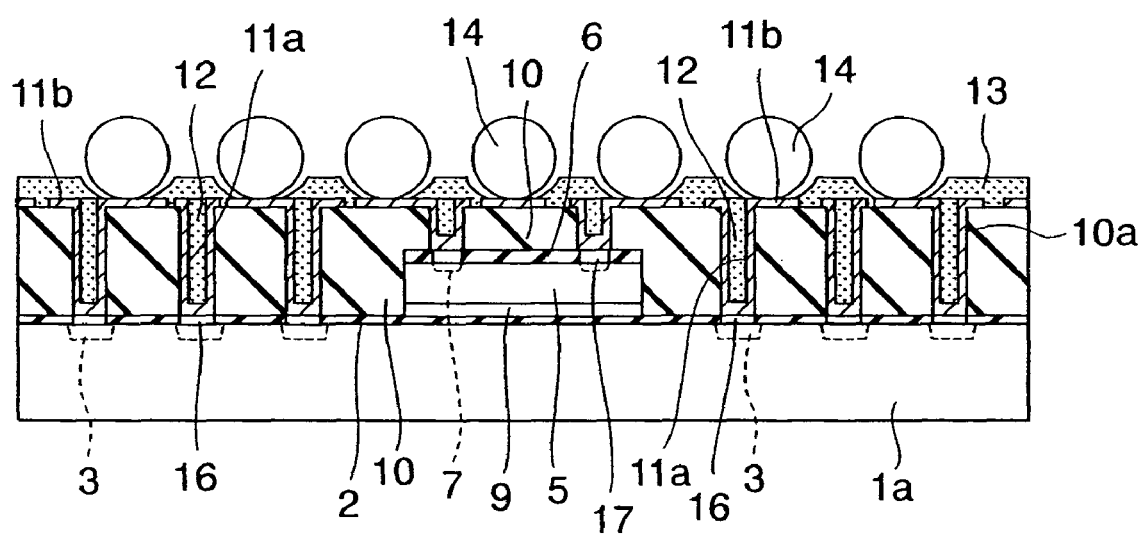
FIG. 14 is a sectional view showing the semiconductor device according to the third embodiment of the present invention.

Then, the semiconductor wafer 1 is divided into a plurality of second semiconductor device chips 1a every device area A. Thus, a semiconductor device shown in FIG. 14 is formed. In this case, the side surfaces of the second semiconductor device chip 1a are not covered with the resin insulating layer 10 and exposed.

According to the above steps, the inorganic alkali used to form the via holes 10a in the resin insulating layer 10 can be prevented from being supplied to the terminals 3, 7 by the coating conductive layers 16, 17, or the laser used to form the via holes 10a can be prevented from being irradiated onto the terminals 3, 7 by the coating conductive layers 16, 17. Thus, the degradation of the first and second terminals 3, 7 can be prevented.

Here, the rewiring patterns may be formed on any one of the first semiconductor device chips 5 and the semiconductor wafer 1. In this case, the terminals 3, 7 that are not covered with the rewiring patterns must be covered with the coating conductive layers 16, 17.

Fourth Embodiment

The first semiconductor device chips 5 shown in FIG. 6B may be connected to the first terminals 3 on the semiconductor wafer 1 via not the third rewiring patterns 11b formed on the upper surface of the resin insulating layer 10 but the wires or the solder balls.

Figure 15:
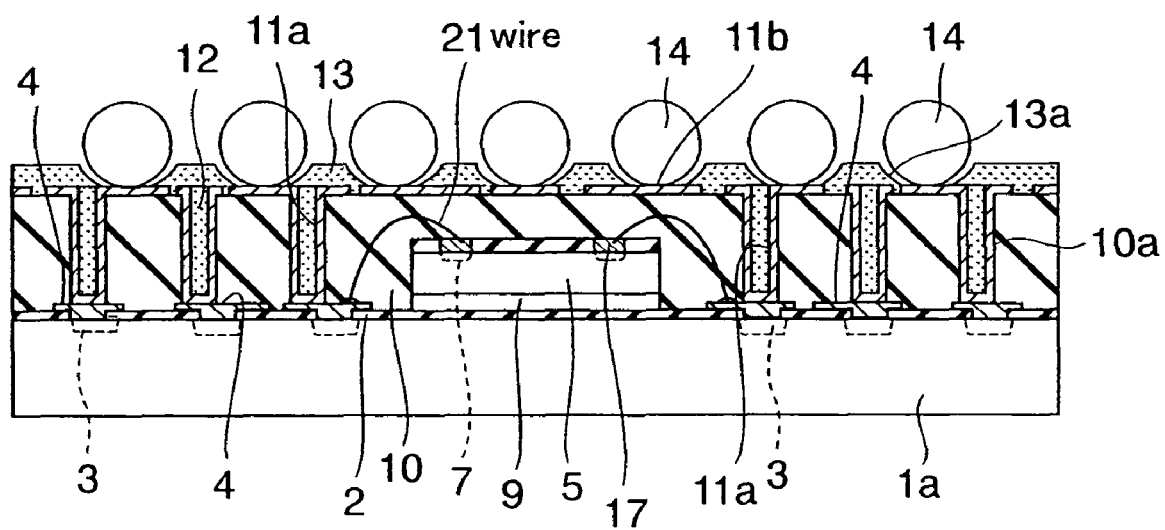
FIG. 15 is a sectional view showing a first semiconductor device according to a fourth embodiment of the present invention.

For example, as shown in FIG. 15, such a structure may be employed that not the rewiring patterns but the coating conductive layers 17 made of nickel-phosphorus are formed on the second terminal 7 of the first semiconductor device chip 5 and then the coating conductive layers 17 and the first rewiring patterns 4 on the semiconductor wafer 1 (the second semiconductor device chip 1a) are connected via gold (conductive) wires 21 by the wire bonding. In this case, no via hole 10a is formed in the resin insulating layer 10 on the first semiconductor device chip 5.

Figure 16:
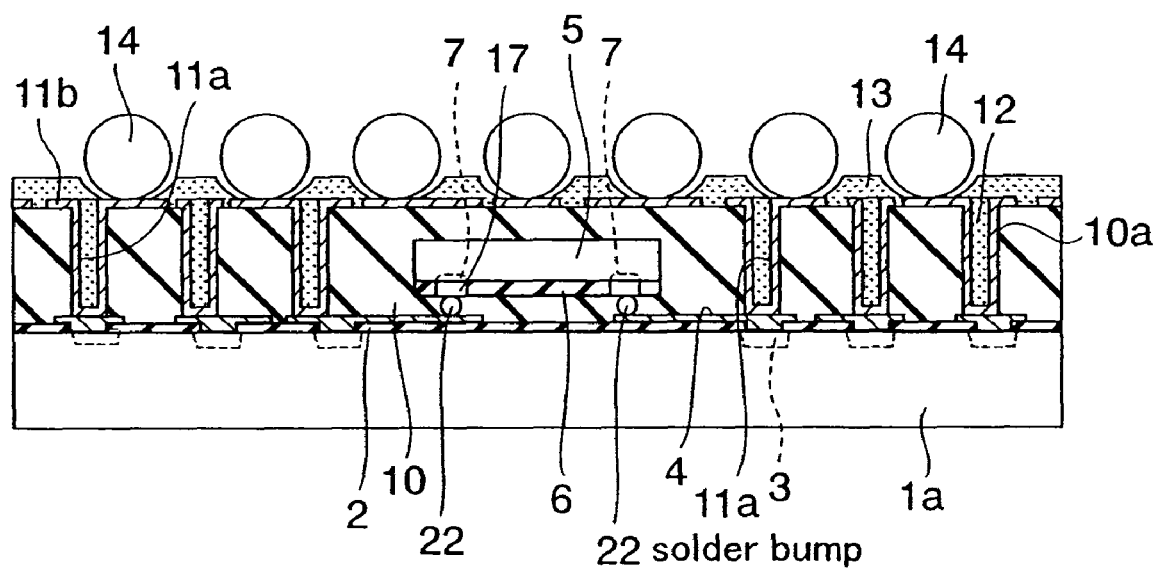
FIG. 16 is a sectional view showing a second semiconductor device according to the fourth embodiment of the present invention.

Also, as shown in FIG. 16, solder bumps (external terminals) 22 may be connected onto the second terminal 7 of the first semiconductor device chip 5, and then the solder bumps 22 may be connected onto the first rewiring patterns 4 on the semiconductor wafer 1 (the second semiconductor device chip 1a). In this case, no via hole 10a is also formed in the resin insulating layer 10 on the first semiconductor device chip 5.

The via holes 10a are not formed in the resin insulating layer 10 shown in FIG. 15, FIG. 16 over the first semiconductor device chips 5, but the third rewiring patterns 11b are formed on the resin insulating layer 10 and then the external terminals 14 are bonded thereon.

As a result, the forming areas of the external terminals 14 on the resin insulating layer 10 can be widened rather than the prior art, and the number of the external terminals 14 can be increased rather than the prior art, and also the narrower pitch between the external terminals 14 can be relaxed.

As described above, according to the present invention, in the semiconductor device having the structure in which the first and second semiconductor chips formed in different size respectively are stacked, the insulating layer for covering the first semiconductor chip is formed on the second semiconductor chip, the holes are formed in the insulating layer, the film-like vias are formed in the hole respectively, and the wiring patterns are formed on the insulating layer. Therefore, the vias can be formed in a short time, and both the wiring patterns and the vias can be formed by the same conductive film, and thus the number of the film forming steps can be reduced.

Also, the wiring patterns on the insulating layer are led onto the first semiconductor chip and then the external terminals are formed on the wiring patterns. Therefore, the narrower pitch between plural external terminals on the insulating layer can be suppressed, and also the number of the external terminals can be increased.

In addition, corrosion of the vias can be prevented by covering the vias in the holes with the insulating layer, and also migration short and corrosion of the first wiring patterns can be prevented by covering the first wiring patterns on the insulating layer except the portions to be connected to the external terminals with another insulating layer.

The invention claimed is:

1. A method for manufacturing a semiconductor device comprising:
   adhering a first semiconductor chip having a first terminal to a semiconductor substrate which is larger than the first semiconductor chip and has a second terminal;
   forming an insulating layer that covers the first semiconductor chip on the semiconductor substrate;
   forming a hole in the insulating layer;
   forming a conductive film in the hole and on the insulating layer;
   patterning the conductive film to leave as a via in the hole and form a wiring on the insulating layer;
   forming a buried insulating layer covering the via only in the hole;
   forming an insulating cover layer on the insulating layer, the wiring and the buried second insulating layer;
   forming an opening, in which the wiring is exposed in the insulating cover layer; and
   connecting an external terminal onto the wiring,
   wherein a metal pattern is formed on at least one of the first terminal and the second terminal, and the hole is formed on the metal pattern.

2. A method for manufacturing a semiconductor device according to claim 1, wherein the metal pattern is a wiring pattern.

3. A method for manufacturing a semiconductor device according to claim 1, wherein the hole is formed by any of a laser irradiation method, a photolithography method, and a drilling method.

4. A method for manufacturing a semiconductor device according to claim 1, wherein the conductive film is a metal film formed by a plating method.

5. A method for manufacturing a semiconductor device according to claim 1, wherein the insulating layer is formed of an epoxy resin or a polyimide resin.

6. A method for manufacturing a semiconductor device according to claim 1, wherein a material of the insulating cover layer is a photosensitive resin.

7. A method for manufacturing a semiconductor device according to claim 1, wherein the metal pattern is made of at least one of titanium, nickel, nickel-phosphorus and gold.

8. A method for manufacturing a semiconductor device comprising:
   adhering a first semiconductor chip having a first terminal to a semiconductor substrate which is larger than the first semiconductor chip and has a second terminal;
   forming an insulating layer that covers the first semiconductor chip on the semiconductor substrate;
   forming a hole in the insulating layer;
   forming a conductive film in the hole and on the insulating layer;
   patterning the conductive film to leave as a via in the hole and form a wiring on the insulating layer;
   forming a buried insulating layer covering the via only in the hole; and connecting an external terminal onto the wiring.

* * * * *

UNITED STATES PATENT AND TRADEMARK OFFICE
CERTIFICATE OF CORRECTION

PATENT NO. : 7,759,246 B2
APPLICATION NO. : 11/477550
DATED : July 20, 2010
INVENTOR(S) : Hirohisa Matsuki et al.

It is certified that error appears in the above-identified patent and that said Letters Patent is hereby corrected as shown below:

On the title page, item 75;
Change

"Tadahiro Okamato, Kawasaki (JP)"

To be

--Tadahiro Okamoto, Kawasaki (JP)--

Signed and Sealed this

Nineteenth Day of October, 2010

David J. Kappos
*Director of the United States Patent and Trademark Office*